US008210358B2

(12) United States Patent
Haddad et al.

(10) Patent No.: US 8,210,358 B2
(45) Date of Patent: Jul. 3, 2012

(54) COLLAPSIBLE DISPLAY

(76) Inventors: Simon Mark Haddad, Norwalk, CT (US); Zbigniew Marchwiak, Mount Prospect, IL (US); Mariusz Kucharczyk, Buffalo Grove, IL (US)

( * ) Notice: Subject to any disclaimer, the term of this patent is extended or adjusted under 35 U.S.C. 154(b) by 728 days.

(21) Appl. No.: 12/356,653

(22) Filed: Jan. 21, 2009

(65) Prior Publication Data

US 2010/0181310 A1 Jul. 22, 2010

(51) Int. Cl.

| | |
|---|---|
| ***B01D 17/06*** | (2006.01) |
| ***B01D 59/40*** | (2006.01) |
| ***B01D 59/50*** | (2006.01) |
| ***C25F 1/00*** | (2006.01) |
| ***C25F 5/00*** | (2006.01) |
| ***C25F 7/00*** | (2006.01) |
| ***C30B 30/02*** | (2006.01) |
| ***C30B 7/12*** | (2006.01) |
| ***C30B 9/14*** | (2006.01) |

(52) U.S. Cl. ....................................... 206/767; 206/600

(58) Field of Classification Search .................. 206/767, 206/514, 386, 600; 220/9.2, 668
See application file for complete search history.

(56) References Cited

U.S. PATENT DOCUMENTS

| | | | | |
|---|---|---|---|---|
| 5,318,219 | A * | 6/1994 | Smith | 229/117.05 |
| 5,743,422 | A * | 4/1998 | Hale | 220/4.33 |
| 6,006,918 | A * | 12/1999 | Hart | 206/600 |
| 7,097,054 | B2 * | 8/2006 | Beck | 206/335 |
| 7,240,799 | B2 * | 7/2007 | Zhang | 206/600 |
| 7,290,663 | B2 * | 11/2007 | Deng et al. | 206/600 |
| 7,669,718 | B1 * | 3/2010 | Patty | 206/774 |

* cited by examiner

*Primary Examiner* — Mickey Yu
*Assistant Examiner* — Rafael Ortiz
(74) *Attorney, Agent, or Firm* — Loeb & Loeb LLP

(57) ABSTRACT

The invention relates to a display system having one or more collapsible crates and at least one creative panel that can be employed to display to various types of items, products, goods or information for sale or non-sale display. The collapsible crates of the invention are less expensive to make and ship, and can be reused over and over again, thus, further decreasing shipping costs over the life of the display system.

18 Claims, 12 Drawing Sheets

FIG. 16A
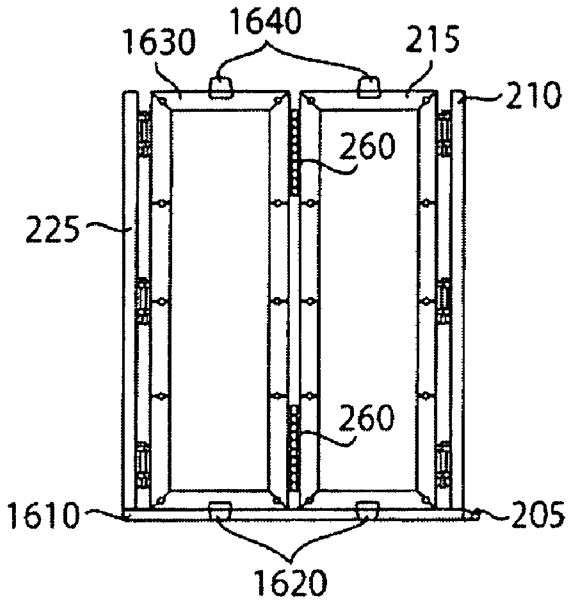
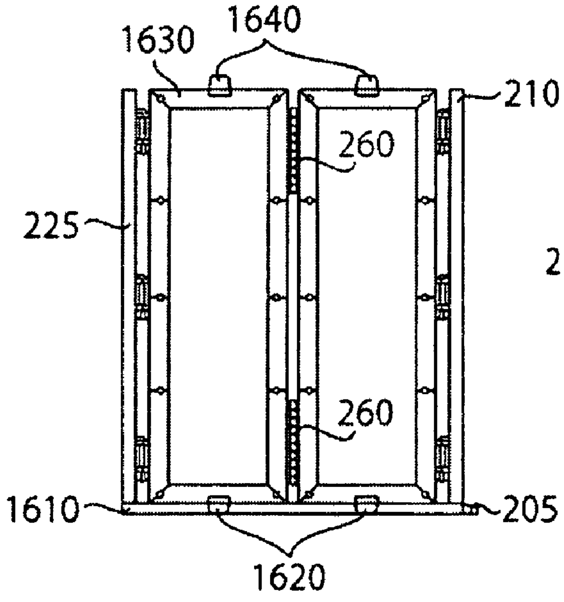
FIG. 16B
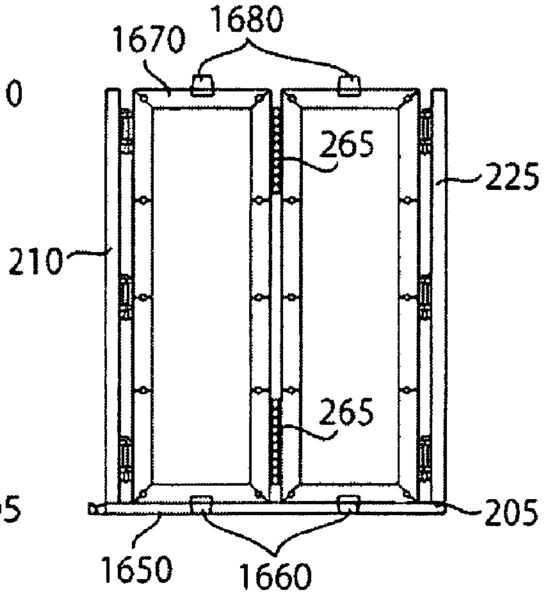
FIG. 16C

COLLAPSIBLE DISPLAY

INTRODUCTION

The invention relates to a collapsible display that can be employed to display to various types of items or products. These items or products can be sale, such as in a retail environment or for a non-sale display, such as in a classroom or museum. The collapsible displays of the invention are less expensive to produce and because the heavier bulky portion can be reused in varying configurations and with varied creative content, the displays cost less than comparable systems.

BACKGROUND OF THE INVENTION

Presently, displays used in retail and other sales establishments are usually pre-constructed. These pre-constructed display systems are impossible to change and make it less desirable to customize the displays of items, products, or goods. Where such pre-constructed display systems are customized to a particular product, they may be wasteful because they may have time limited use or may become worn over time and, thus, unappealing.

Where attempts to make such display systems more disposable have been made, these systems have been unsatisfactory in some respect. For instance, the more disposable a display systems, the more difficult it can be to maintain and the more likely it will break because it is—by definition—less substantial. For example, it is undesirable to display heavy items, such as soup cans, on these more disposable-type displays because they cause sagging and potential for collapse.

There is a need for low cost, reusable, and customizable display systems for retail or other sales outlets to display items, products, goods.

BRIEF DESCRIPTION OF THE INVENTION

The invention relates to a collapsible display comprising a collapsible crate and at least one creative panel covering at least a portion of the walls of the crate. The crate has a bottom wall, a back wall, a first side wall, a second side wall, and a front wall, the first and second side walls being opposite one another, a back edge of the first side wall hinged to a left side of the back wall, a front edge of the first side wall hinged to a left side of the front wall, a back edge of the second side wall hinged to a right side of the back wall, a front edge of the second side wall hinged to a right side of the front wall, a back edge of the bottom wall connected to a bottom edge of the back wall such that the bottom wall is articulatable to a position perpendicular to the back wall, forming a void between the back, front, first side and second side walls, each of the first and second side walls including a bifurcating hinge about which each of the first and second side walls can be collapsed into the void. When deployed in complete articulation, the void can be used to display items, products, or goods that are readily accessible to consumers for purchase.

The invention also relates to a display system comprised of one or more collapsible crates, as described, wherein at least one creative panel is inserted into the interior of the crate and folds around the outside the first and second sidewalls of the crate, and wherein the cover fits over the outside of at least one of the one or more collapsible crates. The display system can be configured in varying ways, depending upon the item, product, or goods to be displayed.

The invention further relates to a method of displaying items, products, and/or goods comprising connecting one or more collapsible crates by mating protrusions located on the top edges of each of the back wall, first side wall, second side wall, and front wall with indentations on the bottom edges of each of the back wall, first side wall, second side wall, and front wall; placing at least one creative panel within at least one of the one or more collapsible crates, wherein the at least one creative panel fits inside the one or more collapsible crates, folds around outside of the first and second side walls of the crate; placing at least creative panel over the outside of the one or more collapsible crates; wherein the at least one creative panel fits over the outside of the one or more collapsible crates and comprises information or advertisement about the items, products, and/or goods being displayed; and placing the items, products, and/or goods inside the one or more collapsible crates, wherein the items, products, and/or goods are displayed. The at least one creative panel may comprise information or advertisements about the items, products, and/or goods being displayed.

Other systems, methods, features, and advantages of the present invention will be or will become apparent to one with skill in the art upon examination of the following figures and detailed description. All such additional systems, methods, features, and advantages are included within this description, are within the scope of the invention, and are protected by the accompanying claims.

BRIEF DESCRIPTION OF THE FIGURES

FIGS. 16A-16C depict the side walls of the collapsible crate of FIG. 2, showing, in particular, the top to bottom connections of the right and left side wall of the crate.

DETAILED DESCRIPTION OF THE INVENTION

Figure 1:
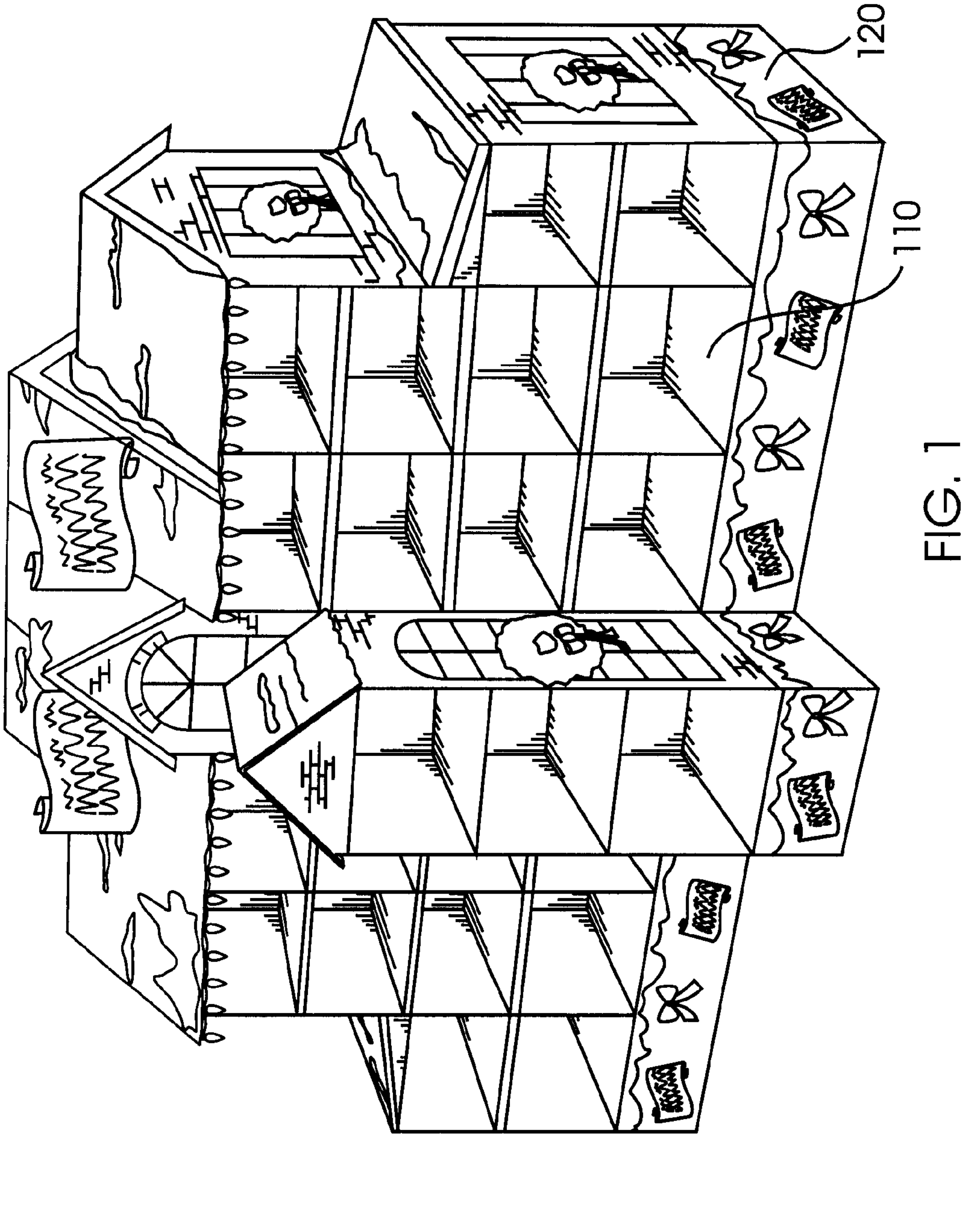
FIG. 1 depicts a display system comprising collapsible crates and at least one creative panel configured as a house for use as a soup display.

The invention relates to a display system as exemplified by FIG. 1. In particular, the display illustrated in FIG. 1 is intended to sell a fictitious soup in the form of a house to convey a message of warmth and comfort for the upcoming cold and flu season. The house is made up one or more of the collapsible crates as specifically described below and creative panels wherein at least one creative panel 110 fits into the interior of the crate and folds around the outside the first and second sidewalls of the crate, and at least one creative panel 120 fits over the outside of one or more collapsible crates. The display of FIG. 1 is achieved by stacking crates in adjacent towers. Those adjacent towers may be connected to each other to provide stability.

In the illustration of FIG. 1, the creative panels cover all of the crates to provide a clean visual effect for the display. It should be understood that in some deployments of the inventive system it may be desirable to leave one or more crates exposed rather than cover all the creates with creative panels.

The combination of collapsible crates and creative panels provide desirable rigidity, lower-cost, reusability as well as other advantages that will be readily apparent to those ordinarily skilled in the art. In this embodiment, the "house" would be capable of supporting soup cans for a lengthy period of time without significant warping or bending due to the weight of the soup cans due to strength and rigidity of the collapsible crates underlying the creative panels. As illustrated in FIG. 1, the creative panels can have pre-printed thereon information and advertisements relating to the product or item.

When the advertiser or end user desires to change the display, new creative panels may be shipped to the retail outlet, preferably with instructions for organization of the crates and deployment of the new creative panels. Of course, as an initial matter, the prior creative panels would be removed from the crates and the prior configuration of the crates would be taken apart. In the preferred embodiment, the operations of tear down and set up should not require the use of any tools. The display system can be configured of one or many collapsible crates and one or more creative panels. By way of example, the arrangement of crates and creative panels can result in displays as far reaching as a locomotive, a school house, an automobile, but is not limited to any of these embodiments. In addition, the display systems can be configured to have open voids on more than one side of the display, allowing three-dimensional display of items, products, or goods. Such displays can be particularly useful for displaying products on an end-cap of a store aisle or in the middle of an open sales floor.

Figure 2:
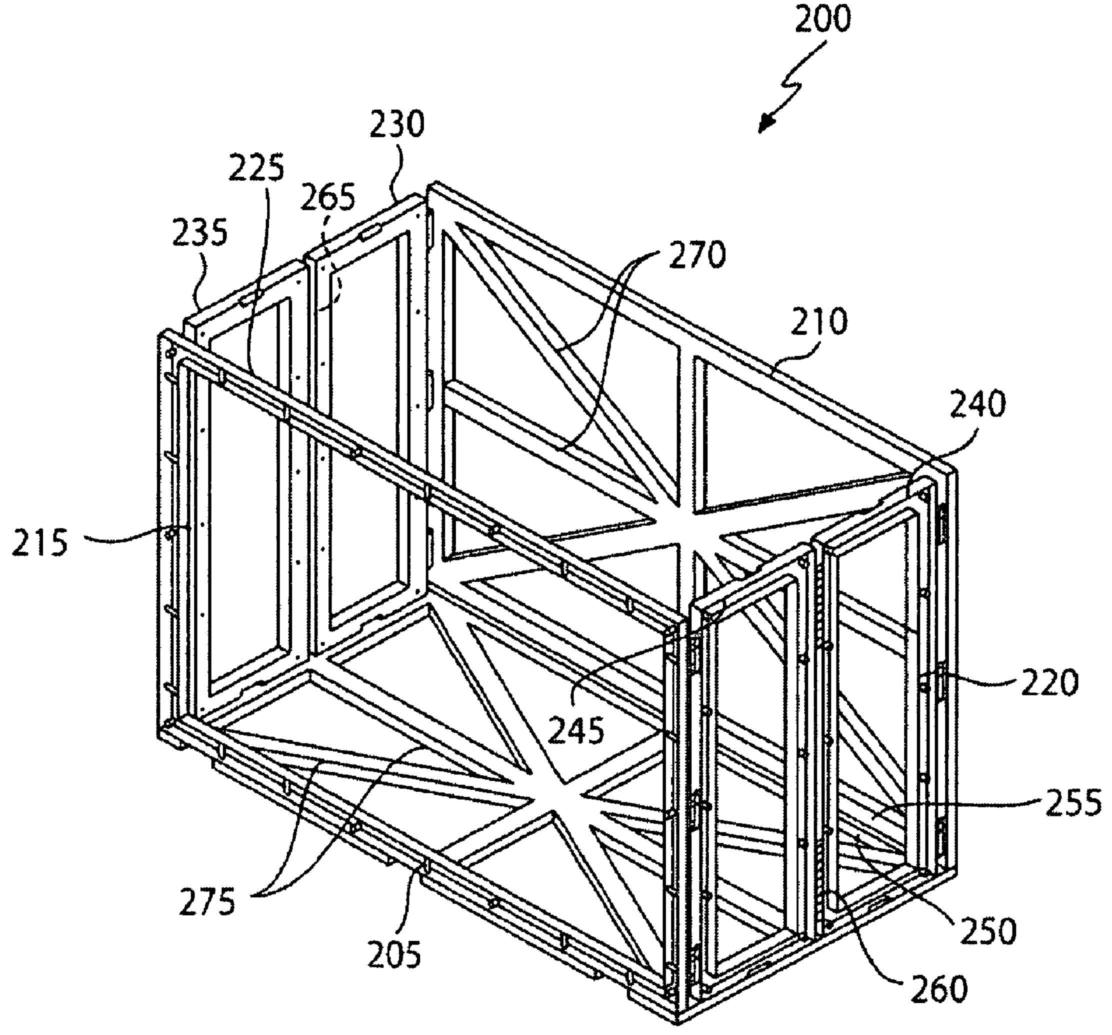
FIG. 2 depicts one particular embodiment of a collapsible crate as fully assembled and articulated.

One of the collapsible crates used in forming the display of FIG. 1 is depicted in FIG. 2. Preferably, each of the crates 200 has identical dimensions to ensure stable operation during interrelation of the crates as part of a unitary display. As one of ordinary skill in the art would understand, the dimensions selected can vary between display groups as a matter of design choice.

Figure 3:
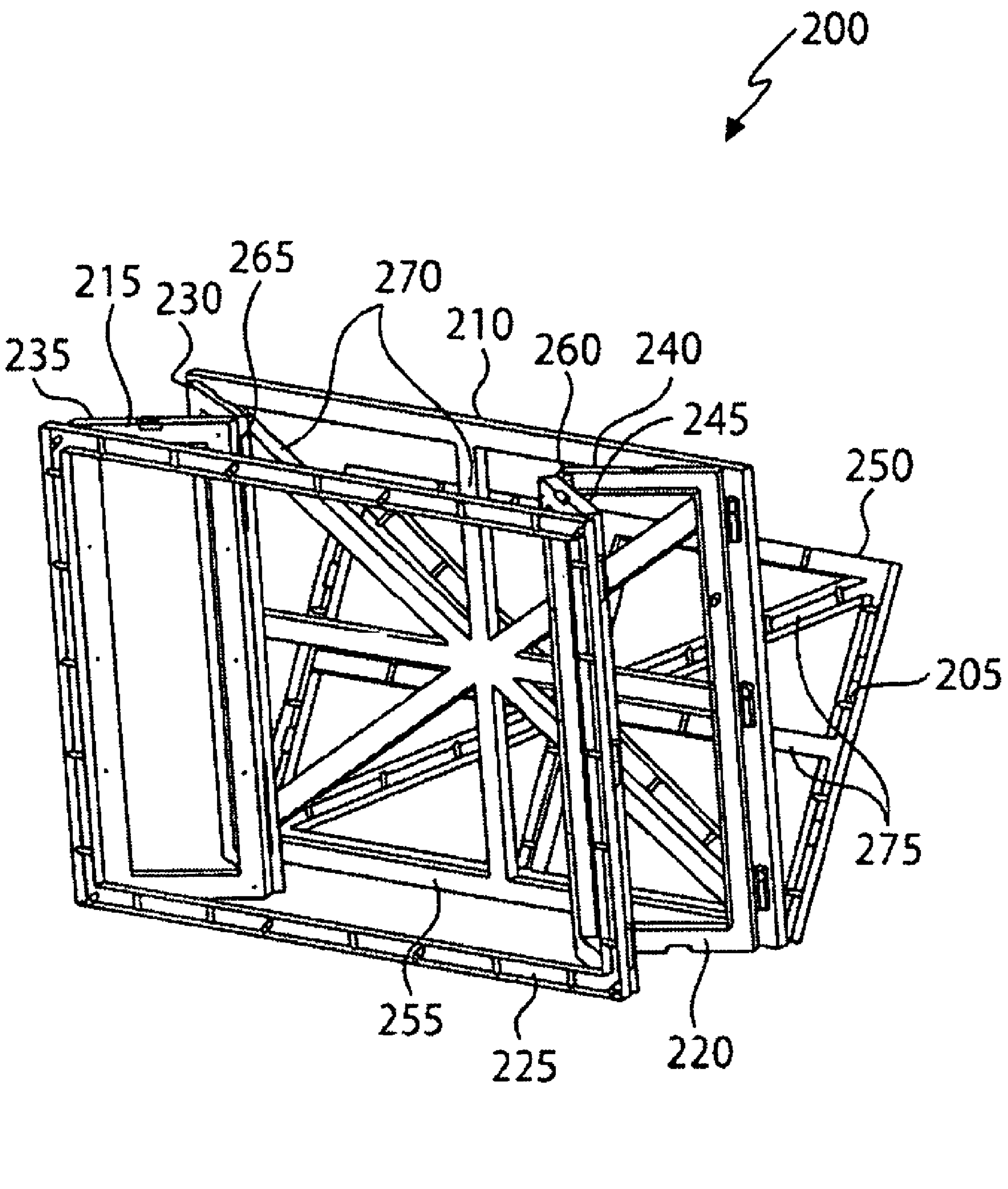
FIG. 3 depicts the collapsible crate of FIG. 2 approximately halfway closed, with the bottom wall in the process of being rotated into its storage and shipping position behind the back wall.
Figure 4:
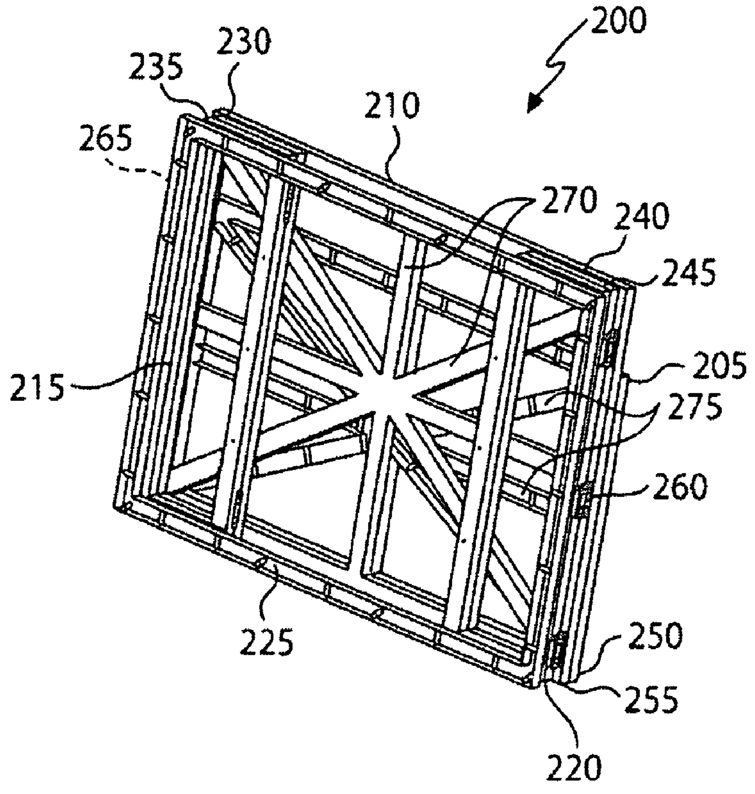
FIG. 4 depicts the collapsible crate of FIG. 2 in a fully collapsed state for storage and shipping.

As shown in FIG. 2, the crate 200 has a bottom wall 205, a back wall 210, a first side wall 215 and second side wall 220, and a front wall 225. In one embodiment, the bottom wall 205 will flip up and the first and second side walls 215, 220, will fold inwards, such that the back wall and front wall 225 are brought substantially together (see, FIG. 14). In its collapsed state, the crate 200 is substantially flat and will therefore conserve space in storage and shipping. This feature makes transportation of the crates (and hence even an initial display) easier and less expensive. FIGS. 3 and 4 show the crate 200 in partially collapsed and completely collapsed states, respectively.

The front wall 225 of the crate 200 should be open (i.e. no cross supports) to allow ready access to consumers to a void formed by the walls 205, 210, 215, 220, 225 of the crate 200 within which products may be stored and displayed. This construction further allows for the insertion of creative panels. As shown in FIG. 2, the first and second side walls 215, 220 are opposite one another, a back edge of the first side wall hinged to a left side of the back wall, a front edge of the first side wall hinged to a left side of the front wall, a back edge of the second side wall hinged to a right side of the back wall, a front edge of the second side wall hinged to a right side of the front wall. Each of the first and second side walls 215, 220 also include a bifurcating hinge about which each of the first and second side walls can be collapsed into the void (see, e.g., FIGS. 3, 4, and 16) for storage and shipping.

For purposes of the present disclosure, a hinge is a type of bearing that connects two solid objects, typically allowing only a limited angle of rotation between them. Two objects connected by an ideal hinge rotate relative to each other about a fixed axis of rotation, or the geometrical axis of the hinge. There are many types of hinges that can be used in practicing the invention. For example, the hinges can be hardware or mechanical hinge, which include, but are not limited to, pivot hinges, piano (or continuous) hinges, butt (or mortise) hinges, concealed hinges, butterfly (or parliament) hinges, strap hinges, H hinges or HL hinges. Hinges nay be made of flexible material, such as a thin plastic, which again would be used to connect two solid objects (i.e. the walls), while allowing a limited angle of rotation. The various walls that are hinged to one another may have a physical hinge connections at one or more discrete points along the edges of the adjoining walls (such as commonly seen between residential interior doors and their associated doorjambs) or there may be a continuous hinge at the junction of the walls. It is contemplated that this continuous hinge could be a flexible plastic sheet connected between the adjoining walls.

Figure 8:
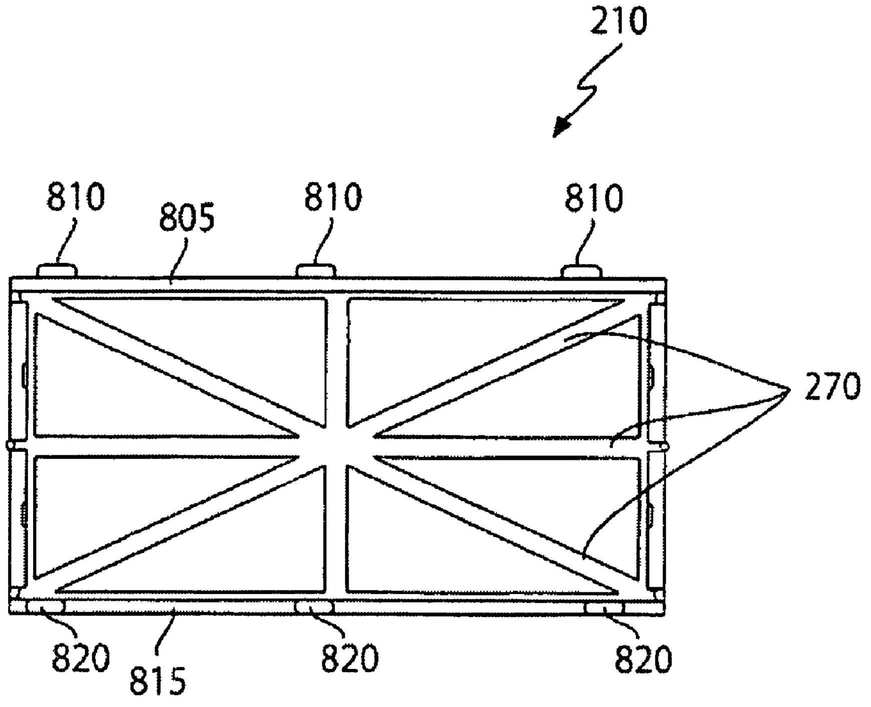
FIG. 8 depicts a plan view of the back wall of the collapsible crate of FIG. 2.
Figure 9:
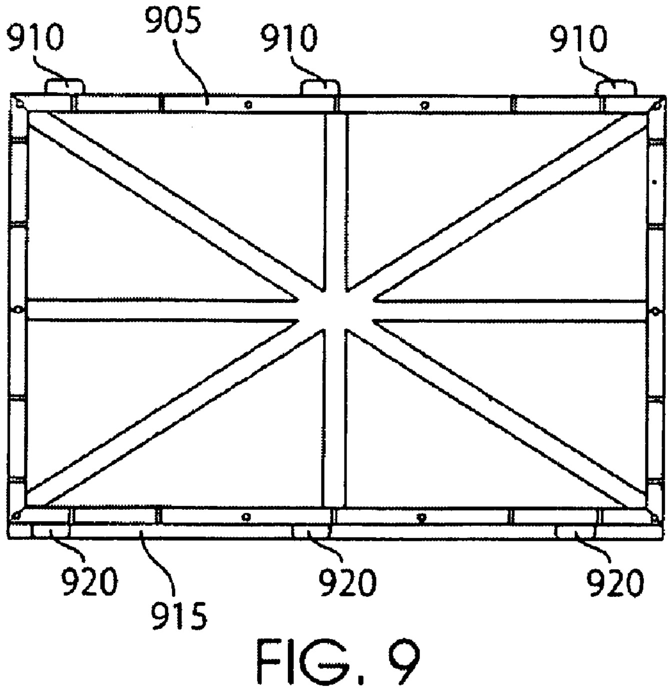
FIG. 9 depicts a plan view of the bottom wall of the collapsible crate of FIG. 2.

In a preferred embodiment, as shown in figures (and most easily seen in FIGS. 8 and 9) the bottom and back walls 205, 210 are constructed in an identical fashion. In particular, both the bottom and back walls have supporting cross members 270, 275, respectively. These supporting cross members may be molded as part of the bottom and back walls or they could be added using mechanical fasteners or adhesives. These cross members 270, 275 provide additional support and structural stability to the crate 200 and, thus, to any display utilizing the crate. As shown in FIGS. 8 and 9, the cross members 270, 275 can attach to adjacent walls or to non-adjacent walls. By constructing bottom and back walls 205, 210 in identical fashion as shown in illustrative embodiment of the figures these parts may be used interchangeably, thus, decreasing the unique part count of the crate, lowering manufacturing complexity, reducing part inventory and facilitating crate repair or part replacement.

Of course, it should be understood, that bottom wall 205 and back wall 210 do not need to be identically constructed. For instance, it is anticipated that the bottom wall may be a different length (however, the widths would probably always be substantially identical). In the crate 200, the back edge of the bottom wall is hinged to a bottom edge of the back wall such that the bottom wall is articulatable to a position perpendicular to the back wall.

The collapsible display crate is easy to manufacture and less-expensive to ship because, when folded, the display crate takes up less room than convention display crates or systems. The first and second side walls can be the same or different, bottom wall and the back wall can be the same. The front wall can be similar to the bottom and back walls, although there are no cross members, leaving the front open for access to the void of the crate to accept a creative panel, and the goods, items, products, or information to be displayed. In one embodiment, there is no top to the display crate of the invention. Manufacturing can be simplified in the preferred embodiment, where the back, front, and bottom walls are at least nearly identical.

Crate 200 can be made of any substantially rigid material, such as plastic or a lightweight metal. In one embodiment, the display can be made of acrylonitrile butadiene styrene (ABS) plastic. Alternatively, the display can be made of polycarbonate or polypropylene.

Figure 5:
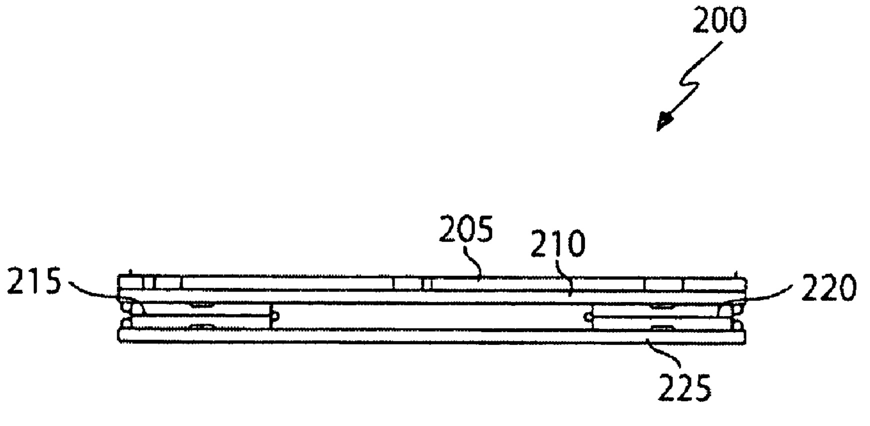
FIG. 5 depicts a top plan view of the collapsed crate of FIG. 4.
Figure 6:
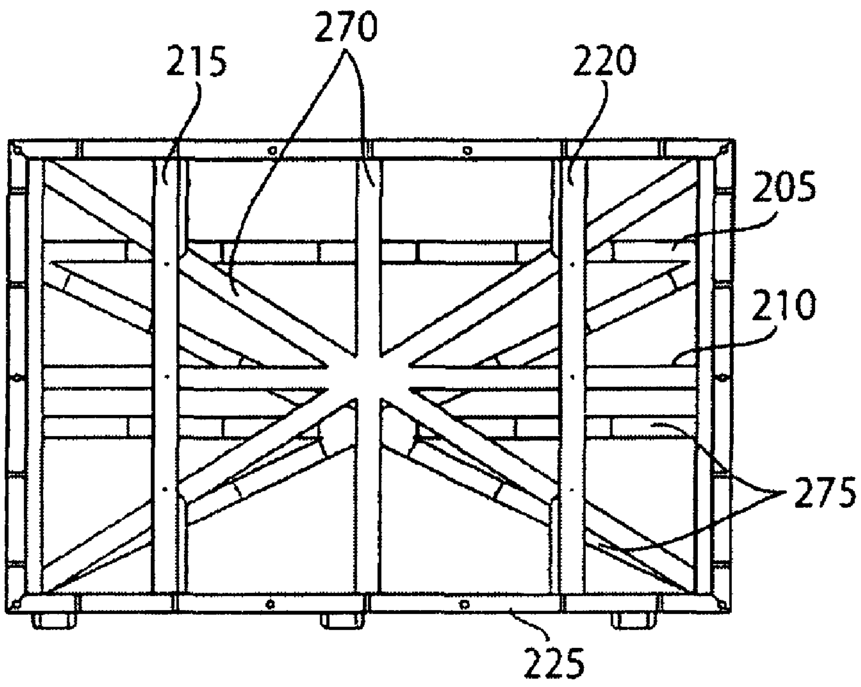
FIG. 6 depicts the front plan view of the collapsed crate of FIG. 4 (including representative dimensions of one particular embodiment).
Figure 7:
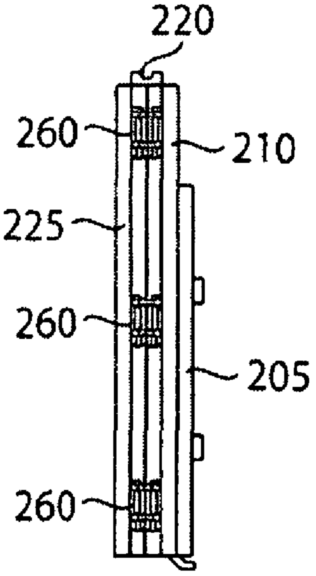
FIG. 7 depicts the side plan view of the collapsed crate of FIG. 4 (including representative dimensions of one particular embodiment).

FIGS. 5-7 illustrate one embodiment display crate having specified dimensions. In this embodiment, the display crate, in its collapsed form, is 30 inches wide, 21 inches high and about 3.7 inches deep, including the protrusions.

As seen in FIG. 8, the crate 200 further includes at least one protrusion 810 along the top edge 805 of the back wall. The crate 200 also comprises at least one indentation 820 along the bottom edge 815 of the back wall 210. The protrusion 810 on the top edge 805 can mate with the indentation 820 on the bottom edge 815 of another crate 200, enabling one or more of the crates 200 to be more stably stacked. As shown in FIG. 9, the bottom wall 205 may also contain at least one protrusion 910 on the back edge 905 of the bottom wall 205 and at least one indentation 920, on the front edge 915 of the bottom wall 205, which are also positioned for mating and stable stacking of the collapsible crates.

Figure 10:
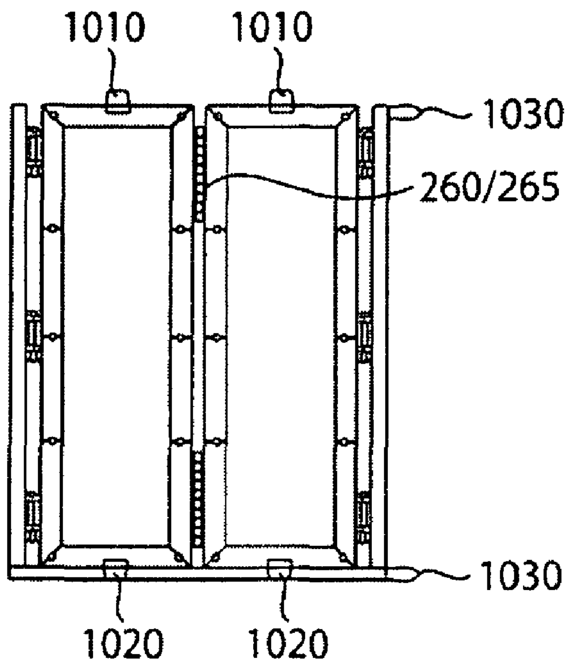
FIG. 10 depicts a plan view of the side wall of the collapsible crate of FIG. 2 in its fully articulated position (including representative dimensions of one particular embodiment).

FIG. 10 depicts a first or second side wall 215, 220 in its extended shape. The side wall folds in through the use of hinges 260, 265. In one embodiment, the bifurcating hinges 260, 265 allow the first and second side walls to fold inwards, collapsing the crate 200 to a more easily transportable or storable dimension. In the depicted embodiment, the placement of the bifurcating hinges 260, 265, the first and second side walls 215, 220 can fold inwards only after the bottom wall 205 is moved out of its fully articulated position. In some embodiments the crates 200 may have at least one protrusion 1010 and at least one indentation 1020 on the top and bottom edges of the first and second side walls 215, 220, respectively, which are positioned to mate in a similar fashion to the at least one protrusion 810 and the at least one indentation 820 on the top and bottom edges 805, 815 of the of the back wall 210. This allows for stable sideways "stacking." Because of the ability to stably mate more than one collapsible crate 200, display systems of many iterations can be constructed for optimal display of items, products, goods, or information. The at least one extension 1030 can be up to about 1 inch in length, or any length that permits stable mating of more than one display crate together. Alternatively, the at least one protrusion can be about 0.5 to about 0.7 inches in length.

Figure 11:
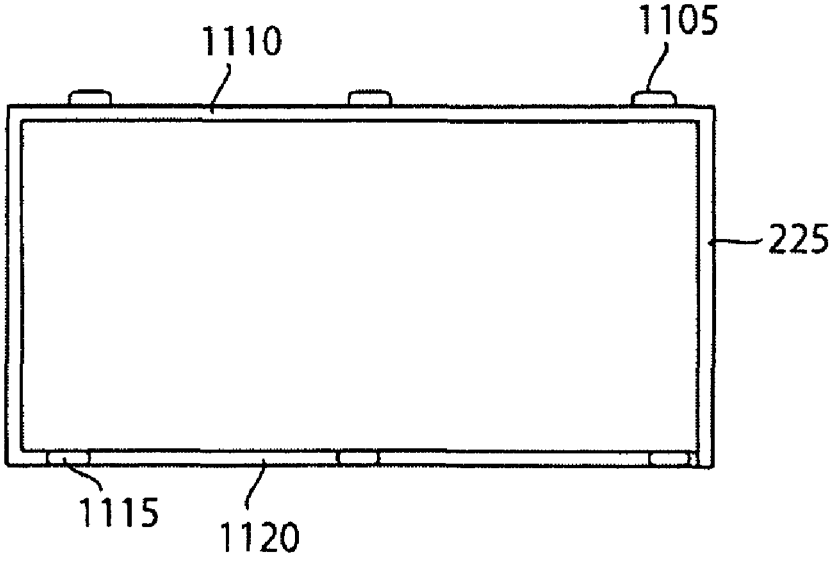
FIG. 11 depicts a plan view of the front wall of the collapsible crate of FIG. 2.

FIG. 11 shows the front wall 225, which has at least one protrusion 1105 on the top edge 1110 of the front wall 225, and at least one indentation 1115 on the bottom edge 1120 of the front wall 225, positioned to allow mating and stable stacking of the collapsible display crates.

Figure 12:
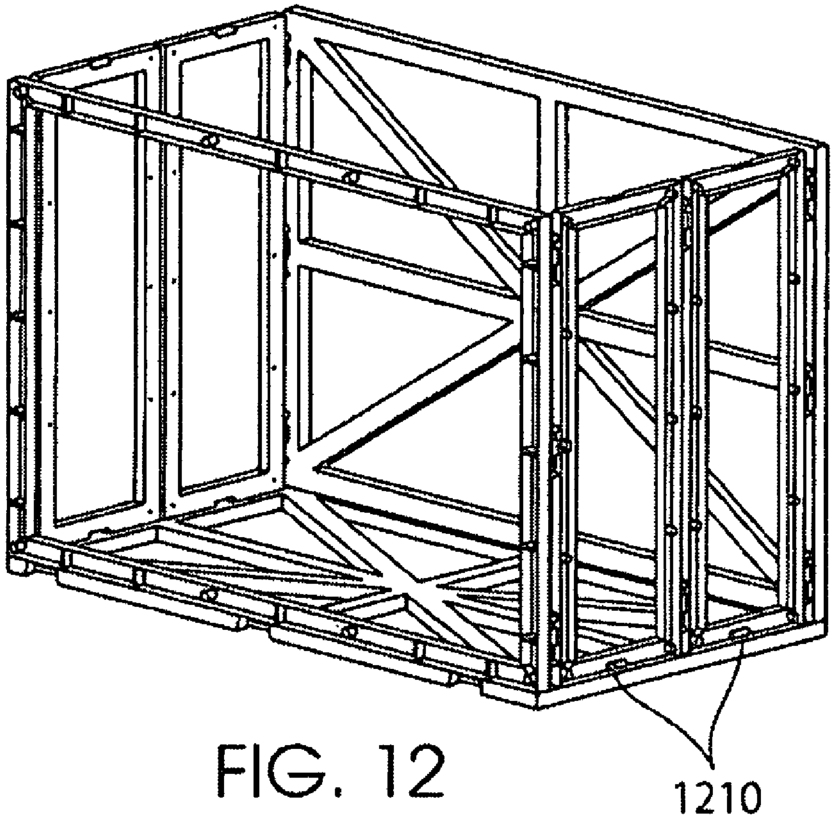
FIG. 12 depicts a perspective view of the fully assembled crate of FIG. 2 highlighting, in particular, the positioning of side frame locks 1210.

FIG. 12 shows an embodiment of the collapsible display crate 200, showing side frame locks 1210, which are used to hold the side walls 215, 220 in their fully articulated position. They can click into place within or on top of the bottom wall 205.

Figure 13:
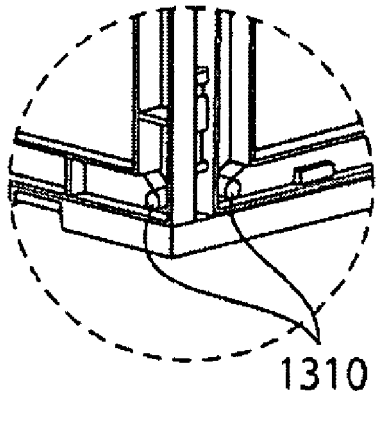
FIG. 13 is a rear perspective view of the collapsible crate of FIG. 2 in a semi-collapsed position along with a magnified view of the bosses 1310 on the front and side walls of the collapsible crate of FIG. 2 used to at least partially secure a creative panel to the crate.

FIG. 13 is an enlarged view of a corner of the collapsible crate 200, where the secure attachment of the creative panels is achieved through the use of bosses. These bosses or clips 1310 can be made of plastic or any other durable material.

Figure 14:
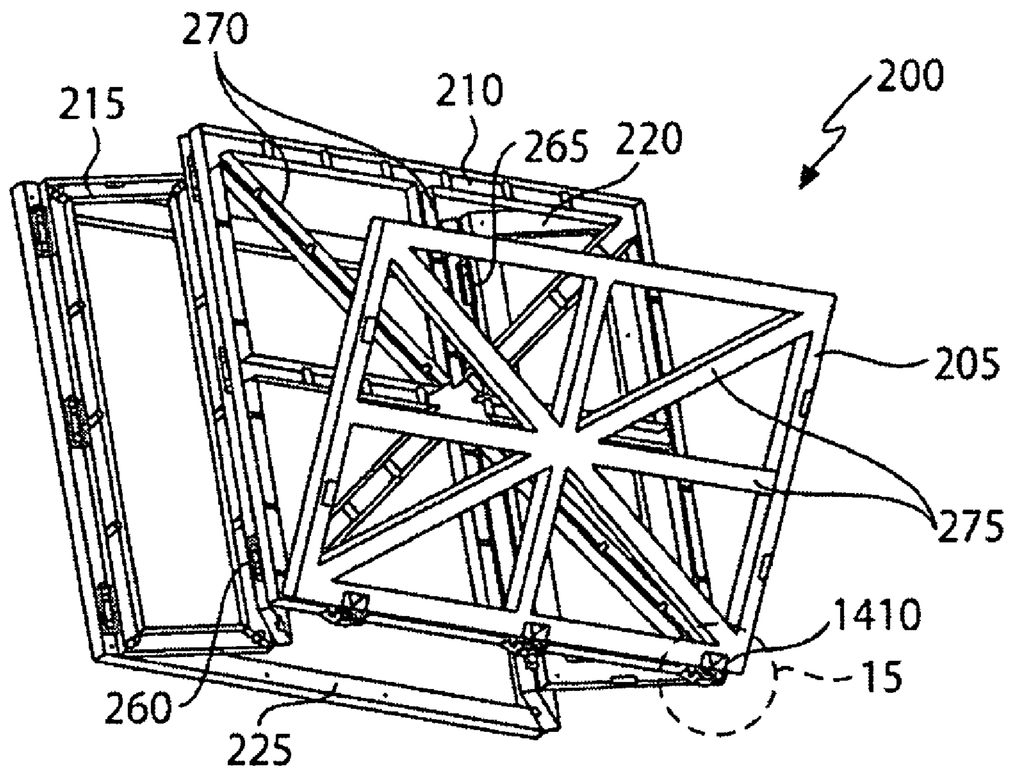
FIG. 14 is a rear perspective view of the collapsible crate of FIG. 2 in a semi-collapsed position depicting how the bottom wall of the collapsible crate is hinged to the back wall in this particular embodiment.
Figure 15:
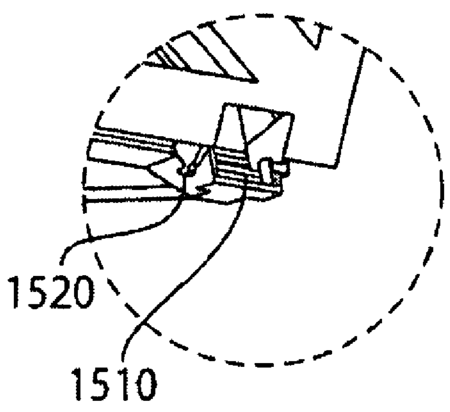
FIG. 15 is a enlarged view of the hinges depicted in the collapsible create of FIG. 14.

FIG. 14 depicts the collapsible display crate 200 as it folds inwards using a hinge assembly 1410 between the bottom wall 205 and the back wall 210. FIG. 15 provides an enlarged view of one hinge 1410, including a channel 1510 and a pin 1520, that may be used in constructing the crate 200.

FIGS. 16A-16C depict additional view of the first and second side walls 215, 220 of the collapsible display crate 200. Here, FIG. 16A shows a first side wall 215 with at least one indentation 1620 on the bottom edge 1610, while FIG. 16B shows another view of the first side wall 215 with at least one protrusion on the top edge 1630, positioned to allow mating and stacking of the collapsible display crates 200. FIG. 16C shows a second side wall 220 for the second side of the collapsible display crate, 200, having similar bottom and top edges 1650, 1670, each edge 1650, 1670 having corresponding indentations 1660 and protrusions 1680, respectively.

Figure 17A:
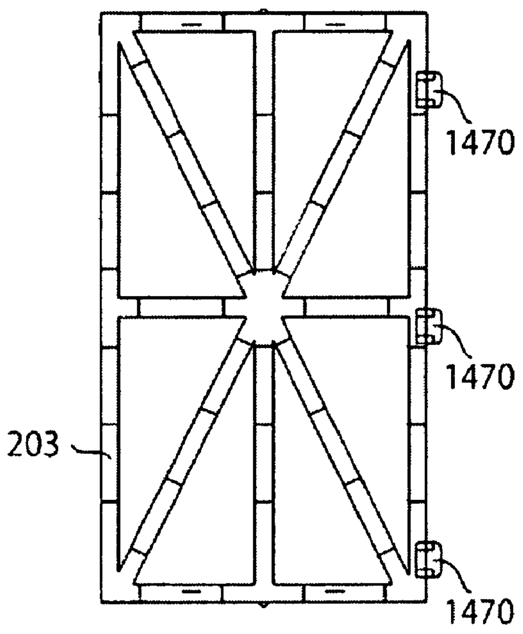
FIGS. 17A-17B depict the bottom and back walls of the crate and the back to back connection of these walls used in the preferred embodiment.
Figure 17B:
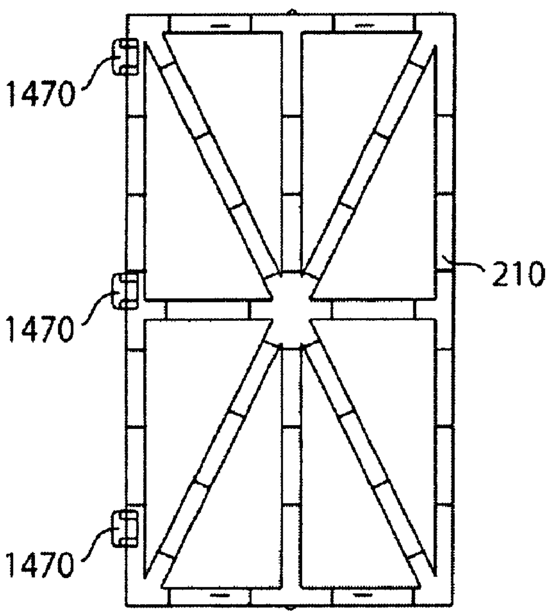

FIGS. 17A-17B show the bottom wall 205 and the back wall 210, respectively with the hinges 1470 in place. The back wall can then flip or fold up into the collapsed configuration of the collapsible display crate.

Figure 18:
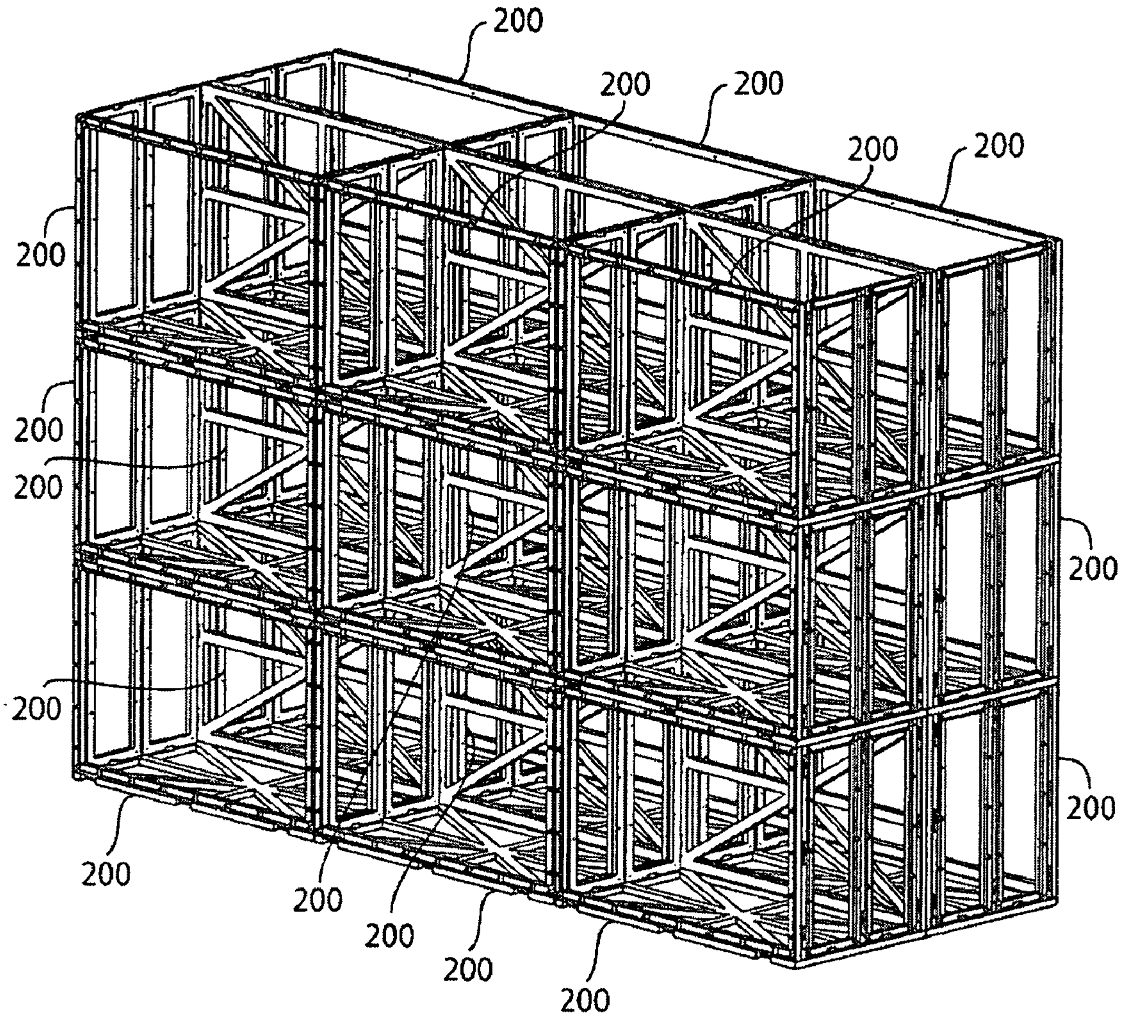
FIG. 18 depicts a display system made of eighteen collapsible display crates.

FIG. 18 shows a stacked configuration of eighteen collapsible display crates 200. Alternatively, the collapsible display crates 200 can be configured in a myriad of ways or with different numbers of collapsible display crates 200.

The collapsible display crate 200 can comprise at least one creative panel. The creative panel can be made of cardboard, paperboard, Mylar, or any other material that is thin enough to be flexible and fold around the edges of the crate. The creative panels are cheap to manufacture and are easily disposed of or replaced as desired. The collapsible displays systems are reusable, with the creative panels changeable in relation to the items, products, or goods being displayed. The creative panel, when folded, or draped, around the outside edges of the collapsible display crate can further comprise advertisements, decorations, drawings, and other information about the items, products, goods, or information being displayed. The creative panel also comprises a bottom and top, so that any items, products, goods or information to be displayed is done so securely. The creative panel can be disposable, so that the information conveyed can be changed with changing items, products, goods, or information.

The collapsible display crate 200 can also comprise at least one additional creative panel that may be attached adjacent the crate 200. The creative panel can be made of cardboard, paperboard, Mylar, or any other material that is thin enough to be flexible and fit over the entire collapsible display crate. The creative panel can further comprise advertisements, decorations, drawings, and other information about the items, products, goods, or information being displayed. The creative panel can be disposable, so that the information conveyed can be changed with changing items, products, goods, or information.

The collapsible display crate of the invention can be made to any dimension useful for displaying goods, items, or products. In one embodiment, the collapsible display crate can measure about 18 to about 34 inches wide; about 12 to about 24 inches high, and about 12 to about 20 inches deep. In another embodiment, the collapsible display crate can measure about 20 to about 28 inches wide; about 16 to about 20 inches high, and about 14 to about 18 inches deep. In another embodiment, the collapsible display crate can measure about 24 inches wide, about 18 inches high, and about 16 inches deep. In still another embodiment, the collapsible display crate can measure about 30 inches wide, about 21 inches high, and about 16 inches wide. The at least one protrusion on the back edge of the first or second side wall can add up to an inch to the depth of the first or second side wall. Alternatively, the at least one protrusions can be about 0.5 to about 0.7 inches in length. The at least one protrusion, in combination with the at least one indentation can be used to connect the collapsible display crates together to form a display system.

The invention also relates to a method of displaying items, products, goods, or information comprising connecting one or more collapsible displays 100 by mating at least one protrusion located on the top edges of each of the back wall, first side wall, second side wall, and front wall with at least one indentations on the bottom edges of each of the back wall, first side wall, second side wall, and front wall; placing at least creative panel within at least one of the one or more collapsible displays, wherein the at least creative panel fits inside the one or more collapsible displays, folds around outside of the first and second side walls of the display, and comprises information or advertisements about the items, products, or goods, being displayed; placing at least one creative panel over the outside of the one or more collapsible display; wherein the at least one creative panel fits over the outside of the one or more collapsible displays and comprises information or advertisement about the items, products, or goods being displayed; and placing the items, products, or goods inside the one or more collapsible displays, wherein the items, products, or goods are displayed. The collapsible displays used in this method have cross members, which can attach to either adjacent or non-adjacent sides of the crate. The collapsible displays can be made of any substantially rigid material. This material can be a plastic, such as a acrylonitrile butadiene styrene (ABS) plastic, or a lightweight metal. Alternatively, the display can be made from polycarbonate or polypropylene.

Having now fully described the invention, it will be understood by those of ordinary skill in the art that the invention may be performed within a wide and equivalent range of conditions, formulations and other parameters without affecting the scope of the invention or any embodiment thereof. All patents, patent applications, and publications cited herein are fully incorporated by reference in their entirety.

What is claimed is:

1. A collapsible display comprising:

a crate having a bottom wall, a back wall, a first side wall, a second side wall, and a fully open front wall, the first and second side walls being opposite one another, a back edge of the first side wall hinged to a left side of the back wall, a front edge of the first side wall hinged to a left side of the front wall, a back edge of the second side wall hinged to a right side of the back wall, a front edge of the second side wall hinged to a right side of the front wall, a back edge of the bottom wall hingedly connected to a bottom edge of the back wall such that the bottom wall is articulatable to a position perpendicular to the back wall forming an accessible void between the back, front, first side and second side walls, each of the first and second side walls including a bifurcating hinge about which each of the first and second side walls can be collapsed into the void; the bottom wall is foldable backwards such that the bottom wall and back wall are substantially parallel when the crate is fully collapsed; and at least one creative panel covering at least a portion of walls of the crate.

2. The display of claim 1, wherein the bottom wall further includes supporting cross members.

3. The display of claim 2, wherein the back wall further includes supporting cross members.

4. The display of claim 3, wherein the crate is made of a substantially rigid material.

5. The display of claim 4, wherein a first creative panel can fit inside the collapsible crate as a liner.

6. The display of claim 5, wherein the first creative panel can fold around the outside of the first and second side walls of the crate to cover the outside of the first and second side walls.

7. The display of claim 1, wherein the crate is made of a substantially rigid material.

8. The display of claim 1, wherein a second creative panel can fit over the outside of the crate.

9. The display of claim 1, further comprising one or more protrusions along the top edges of each of the back wall, the first side wall, the second side wall, and the front wall; and one or more indentations along the bottom edges of each of the back wall, the first side wall, the second side wall, and the front wall, wherein the protrusions along the top edges are positioned to mate with the indentations along the bottom edges.

10. A display system comprising one or more of a collapsible display, each collapsible display comprising a crate having a bottom wall, a back wall, a first side wall, a second side wall, and a fully open front wall, the first and second side walls being opposite one another, a back edge of the first side wall hinged to a left side of the back wall, a front edge of the first side wall hinged to a left side of the front wall, a back edge of the second side wall hinged to a right side of the back wall, a front edge of the second side wall hinged to a right side of the front wall, a back edge of the bottom wall hingedly connected to a bottom edge of the back wall such that the bottom wall is articulatable to a position perpendicular to the back wall forming an accessible void between the back, front, first side and second side walls, each of the first and second side walls including a bifurcating hinge about which each of the first and second side walls can be collapsed into the void; the bottom wall is foldable backwards such that the bottom wall and back wall are substantially parallel when the crate is fully collapsed; and at least one creative panel covering at least a portion of walls of the crate, wherein the at least one creative panel fits into the interior of the crate and folds around the outside the first and second sidewalls of the crate or fits over the outside of the crate; and wherein the bottom wall and the back wall comprise supporting cross members.

11. The display system of claim 10, wherein the supporting cross members of the crate attach to non-adjacent walls.

12. The display system of claim 11, wherein the supporting cross members of the crate attach to adjacent walls.

13. The display system of claim 12, wherein the crate is made of a substantially rigid material.

14. The display system of claim 10, wherein the crate comprises one or more protrusions along the top edges of each of the back wall, the first side wall, the second side wall, and the front wall; and one or more indentations along the bottom edges of each of the back wall, the first side wall, the second side wall, and the front wall, wherein the protrusions along the top edges are positioned to mate with the indentations along the bottom edges.

15. A method of displaying items, products, or goods comprising connecting one or more collapsible displays, each collapsible display comprising a crate having a bottom wall, a back wall, a first side wall, a second side wall, and a fully open front wall, the first and second side walls being opposite one another, a back edge of the first side wall hinged to a left side of the back wall, a front edge of the first side wall hinged to a left side of the front wall, a back edge of the second side wall hinged to a right side of the back wall, a front edge of the second side wall hinged to a right side of the front wall, a back edge of the bottom wall hingedly connected to a bottom edge of the back wall such that the bottom wall is articulatable to a position perpendicular to the back wall forming an accessible void between the back, front, first side and second side walls, each of the first and second side walls including a bifurcating hinge which each of the first and second side walls can be collapsed into the void; the bottom wall is foldable backwards such that the bottom wall and back wall are substantially parallel when the crate is fully collapsed; and at least one creative panel covering at least a portion of walls of the crate, wherein the at least one creative panel fits into the interior of the crate and folds around the outside the first and second sidewalls of the crate or fits over the outside of the crate; and wherein the bottom wall and the back wall comprise supporting cross members by mating protrusions located on the top edges of each of the back wall, first side wall, second side wall, and front wall with indentations on the bottom edges of each of the of the back wall, first side wall, second side wall, and front wall;

placing at least one creative panel within at least one of the one or more collapsible crates, wherein the at least one creative panel fits inside the one or more collapsible, and folds around outside of the first and second side walls of the crate, placing at least one creative panel over the outside of the one or more collapsible displays; wherein the at least one cover fits over the outside of the one or more collapsible displays and comprises information or advertisement about the items, products, or goods; and placing the items, products, goods, or information inside the one or more collapsible displays, wherein the items, products, or goods are displayed.

16. The method of claim 15, wherein the supporting cross members attach to non-adjacent walls.

17. The method of claim 15, wherein the supporting cross members attach to adjacent walls.

18. The method of claim 15, wherein the crate is made of a substantially rigid material.

* * * * *